(12) United States Patent
Cissell et al.

(10) Patent No.: US 9,373,677 B2
(45) Date of Patent: Jun. 21, 2016

(54) DOPING OF ZRO$_2$ FOR DRAM APPLICATIONS

(75) Inventors: Julie Cissell, Houston, TX (US); Chongying Xu, New Milford, CT (US); Thomas M. Cameron, Newtown, CT (US); William Hunks, Waterbury, CT (US); David W. Peters, Kingsland, TX (US)

(73) Assignee: ENTEGRIS, INC., Billerica, MA (US)

( * ) Notice: Subject to any disclaimer, the term of this patent is extended or adjusted under 35 U.S.C. 154(b) by 19 days.

(21) Appl. No.: 13/808,165

(22) PCT Filed: Jun. 23, 2011

(86) PCT No.: PCT/US2011/041545
§ 371 (c)(1),
(2), (4) Date: Jan. 28, 2013

(87) PCT Pub. No.: WO2012/005957
PCT Pub. Date: Jan. 12, 2012

(65) Prior Publication Data
US 2013/0122722 A1  May 16, 2013

Related U.S. Application Data

(60) Provisional application No. 61/362,275, filed on Jul. 7, 2010.

(51) Int. Cl.
*H01L 49/02* (2006.01)
*H01L 21/02* (2006.01)

(52) U.S. Cl.
CPC ............ *H01L 28/40* (2013.01); *H01L 21/0228* (2013.01); *H01L 21/02189* (2013.01); *H01L 21/02194* (2013.01)

(58) Field of Classification Search
None
See application file for complete search history.

(56) References Cited

U.S. PATENT DOCUMENTS

| 4,915,988 A | 4/1990 | Erbil |
| 4,927,670 A | 5/1990 | Erbil |

(Continued)

FOREIGN PATENT DOCUMENTS

| EP | 0904568 B1 | 4/2001 |
| EP | 1798307 A1 | 6/2007 |

(Continued)

OTHER PUBLICATIONS

Fischer Applied Physics Letters V92 2008 p. 01298 1-3.*

(Continued)

*Primary Examiner* — Joseph Miller, Jr.
(74) *Attorney, Agent, or Firm* — Hultquist, PLLC; Steven J. Hultquist; Maggie Chappuis

(57) ABSTRACT

A method of forming a dielectric material, comprising doping a zirconium oxide material, using a dopant precursor selected from the group consisting of Ti(NMe$_2$)$_4$; Ti(NMeEt)$_4$; Ti(NEt$_2$)$_4$;TiCl4; tBuN=Nb(NEt$_2$)$_3$; tBuN=Nb(NMe$_2$)$_3$; t-BuN=Nb(NEtMe)$_3$; t-AmN=Nb(NEt$_2$)$_3$; t-AmN=Nb(NEtMe)$_3$; t-AmN=Nb(NMe$_2$)$_3$; t-AmN=Nb(OBu-t)$_3$; Nb-13; Nb(NEt$_2$)$_4$; Nb(NEt$_2$)$_5$; Nb(N(CH$_3$)$_2$)$_5$; Nb(OC2H$_5$)$_5$; Nb(thd)(OPr-i)$_4$; SiH(OMe)$_3$; SiCU; Si(NMe$_2$)$_4$; (Me$_3$Si)$_2$NH; GeR$^a$x(OR$^b$)$_{4-x}$ wherein x is from 0 to 4, each R$^a$ is independently selected from H or C$_1$-C$_8$ alkyl and each R$^b$ is independently selected from C$_1$-C$_8$ alkyl; GeCl$_4$; Ge(NR$^a_2$)$_4$ wherein each R$^a$ is independently selected from H and C$_1$-C$_8$ alkyl; and (R$^b_3$Ge)$_2$NH wherein each R$^b$ is independently selected from C$_1$-C$_8$ alkyl; bis(N,N'-diisopropyl-1,3-propanediamide) titanium; and tetrakis(isopropylmethylamido) titanium; wherein Me is methyl, Et is ethyl, Pr-i is isopropyl, t-Bu is tertiary butyl, t-Am is tertiary amyl, and thd is 2,2,6,6-tetramethyl-3,5-heptanedionate. Doped zirconium oxide materials of the present disclosure are usefully employed in ferroelectric capacitors and dynamic random access memory (DRAM) devices.

20 Claims, 1 Drawing Sheet

(56) References Cited

U.S. PATENT DOCUMENTS

| | | | |
|---|---|---|---|
| 4,948,623 | A | 8/1990 | Beach et al. |
| 4,960,916 | A | 10/1990 | Pazik |
| 4,962,214 | A | 10/1990 | Villacorta et al. |
| 5,204,057 | A | 4/1993 | Ishigami et al. |
| 5,204,314 | A | 4/1993 | Kirlin et al. |
| 5,225,561 | A | 7/1993 | Kirlin et al. |
| 5,280,012 | A | 1/1994 | Kirlin et al. |
| 5,453,494 | A | 9/1995 | Kirlin et al. |
| 5,536,323 | A | 7/1996 | Kirlin et al. |
| 5,555,154 | A | 9/1996 | Uchikawa et al. |
| 5,711,816 | A | 1/1998 | Kirlin et al. |
| 5,770,921 | A | 6/1998 | Aoki et al. |
| 5,820,664 | A | 10/1998 | Gardiner et al. |
| 5,837,417 | A | 11/1998 | Rahman et al. |
| 5,840,897 | A | 11/1998 | Kirlin et al. |
| 5,919,522 | A | 7/1999 | Baum et al. |
| 6,024,847 | A | 2/2000 | Rosenberg et al. |
| 6,025,222 | A | 2/2000 | Kimura et al. |
| 6,087,500 | A | 7/2000 | Fukuda et al. |
| 6,110,529 | A | 8/2000 | Gardiner et al. |
| 6,111,122 | A | 8/2000 | Paw et al. |
| 6,177,558 | B1 | 1/2001 | Brennan et al. |
| 6,218,518 | B1 | 4/2001 | Baum et al. |
| 6,277,436 | B1 | 8/2001 | Stauf et al. |
| 6,340,386 | B1 | 1/2002 | Hendrix et al. |
| 6,506,666 | B2 | 1/2003 | Marsh |
| 6,511,706 | B1 | 1/2003 | Hendrix et al. |
| 6,562,678 | B1 | 5/2003 | Uchiyama et al. |
| 6,599,447 | B2 | 7/2003 | Stauf et al. |
| 6,646,122 | B1 | 11/2003 | Nuhlen et al. |
| 6,660,331 | B2 | 12/2003 | Hendrix et al. |
| 6,787,186 | B1 | 9/2004 | Hintermaier |
| 6,869,638 | B2 | 3/2005 | Baum et al. |
| 6,984,591 | B1 | 1/2006 | Buchanan et al. |
| 6,989,457 | B2 | 1/2006 | Kamepalli et al. |
| 7,108,747 | B1 | 9/2006 | Leskela et al. |
| 7,250,367 | B2 | 7/2007 | Vaartstra et al. |
| 7,635,441 | B2 | 12/2009 | Kadokura et al. |
| 7,638,074 | B2 | 12/2009 | Xu et al. |
| 7,682,593 | B2 | 3/2010 | Robert et al. |
| 7,790,629 | B2 | 9/2010 | Holme et al. |
| 2002/0004266 | A1 | 1/2002 | Hashimoto et al. |
| 2002/0067917 | A1 | 6/2002 | Takamatsu et al. |
| 2002/0090815 | A1 | 7/2002 | Koike et al. |
| 2003/0012876 | A1 | 1/2003 | Min et al. |
| 2003/0072882 | A1 | 4/2003 | Niinisto et al. |
| 2004/0038808 | A1 | 2/2004 | Hampden-Smith et al. |
| 2004/0043149 | A1 | 3/2004 | Gordon et al. |
| 2004/0173918 | A1 | 9/2004 | Kamal et al. |
| 2004/0197946 | A1 | 10/2004 | Vaartstra et al. |
| 2004/0211998 | A1 | 10/2004 | Araujo et al. |
| 2005/0009325 | A1 | 1/2005 | Chung et al. |
| 2005/0208699 | A1 | 9/2005 | Furkay et al. |
| 2005/0217575 | A1 | 10/2005 | Gealy et al. |
| 2005/0277780 | A1 | 12/2005 | Gordon et al. |
| 2006/0006449 | A1 | 1/2006 | Jeong et al. |
| 2006/0027451 | A1 | 2/2006 | Park et al. |
| 2006/0035462 | A1 | 2/2006 | Millward |
| 2006/0049447 | A1 | 3/2006 | Lee et al. |
| 2006/0076609 | A1* | 4/2006 | Chindalore et al. ........... 257/316 |
| 2006/0115595 | A1 | 6/2006 | Shenai-Khatkhate et al. |
| 2006/0138393 | A1 | 6/2006 | Seo et al. |
| 2006/0172067 | A1 | 8/2006 | Ovshinsky et al. |
| 2006/0172083 | A1 | 8/2006 | Lee et al. |
| 2006/0180811 | A1 | 8/2006 | Lee et al. |
| 2006/0244100 | A1* | 11/2006 | Ahn et al. ...................... 257/532 |
| 2006/0275545 | A1 | 12/2006 | Yoshinaka et al. |
| 2007/0154637 | A1 | 7/2007 | Shenai-Khatkhate et al. |
| 2007/0262715 | A1 | 11/2007 | Yan et al. |
| 2008/0141937 | A1 | 6/2008 | Clark |
| 2008/0176375 | A1* | 7/2008 | Erben ................ C23C 16/0272 438/386 |
| 2008/0182427 | A1* | 7/2008 | Oberbeck et al. ............. 438/785 |
| 2008/0193642 | A1* | 8/2008 | Yoon et al. ................ 427/248.1 |
| 2008/0199975 | A1 | 8/2008 | Park et al. |
| 2008/0241555 | A1* | 10/2008 | Clark ............................ 428/457 |
| 2008/0242097 | A1* | 10/2008 | Boescke et al. ............... 438/703 |
| 2008/0254218 | A1 | 10/2008 | Lei et al. |
| 2009/0001618 | A1 | 1/2009 | Kadokura et al. |
| 2009/0004383 | A1 | 1/2009 | Kadokura et al. |
| 2009/0074965 | A1 | 3/2009 | Xu et al. |
| 2009/0136658 | A1 | 5/2009 | Yoshinaka et al. |
| 2010/0062150 | A1 | 3/2010 | Xu et al. |
| 2010/0270508 | A1* | 10/2010 | Xu et al. ....................... 252/500 |
| 2012/0141675 | A1 | 6/2012 | Xu et al. |

FOREIGN PATENT DOCUMENTS

| | | |
|---|---|---|
| EP | 2000561 A1 | 12/2008 |
| JP | 2-225317 A | 9/1990 |
| JP | 7-70747 A | 3/1995 |
| JP | 7-249616 A | 9/1995 |
| JP | 10-125237 A | 5/1998 |
| JP | 10-273779 A | 10/1998 |
| JP | 2002-525426 A | 8/2002 |
| JP | 2003-526219 A | 9/2003 |
| JP | 2004-527651 A | 9/2004 |
| JP | 2004-300152 A | 10/2004 |
| JP | 2005-512323 A | 4/2005 |
| JP | 2006-37123 A | 2/2006 |
| SU | 768457 A | 10/1980 |
| WO | 0015865 A1 | 3/2000 |
| WO | 0166834 A2 | 9/2001 |
| WO | 2006132107 A1 | 12/2006 |
| WO | 2012177642 A2 | 12/2012 |

OTHER PUBLICATIONS

Tomida App Phys Letter V89 p. 142902 2006.*

Anderson, Q., et al., "Synthesis and Characterization of the First Pentaphenylcyclopentadienyl Copper(I) Complex, (Ph5Cp)Cu(PPh3)", "Organometallics", 1998, pp. 4917-4920, vol. 17.

Artaud-Gillet, M., et al., "Evaluation of copper organometallic sources for CuGaSe2 photovoltaic applications", "Journal of Crystal Growth", 2003, pp. 163-168, vol. 248.

Burns, C., et al., "Organometallic Coordination Complexes of the Bis (Pentamethylcyclopentadienyl)-Alkaline Earth Compounds, (ME5C5)2MLN, Where M is Mg, Ca, Sr, or Ba and ME5C5BECL.", "Journal of Organometallic Chemistry", 1987, pp. 31-37, vol. 325.

Christen, H., et al., "Semiconducting epitaxial films of metastable SrRu0.5Sn0.5O3 grown by pulsed laser deposition", "Applied Physics Letters", 1997, pp. 2147-2149 (Title and Abstract), vol. 70, No. 16.

Hatanpaa, T., et al., "Synthesis and characterisation of cyclopentadienyl complexes of barium: precursors for atomic layer deposition of BaTiO3", "Dalton Trans.", Mar. 22, 2004, pp. 1181-1188, vol. 8.

Holme, T., et al., "Atomic Layer Deposition and Chemical Vapor Deposition Precursor Selection Method Application to Strontium and Barium Precursors", "J. Phys. Chem.", Jul. 27, 2007, pp. 8147-8151, vol. 111, No. 33.

Kirlin, P., et al., "Thin Films of Barium Fluoride Scintillator Deposited by Chemical Vapor Deposition", "Nuclear Instruments and Methods in Physics Research", 1990, pp. 261-264, vol. A289.

Kirlin, P., et al., "Growth of High Tc YBaCuO Thin Films by Metalorganic Chemical Vapor Deposition", "SPIE", 1989, pp. 115-127, vol. 1187.

Kvyatkovskii, O., "On the Nature of Ferroelectricity in Sr1—xAxTiO3 and KTa1—xNbxO3 Solid Solutions", "Physics of the Solid State", 2002, pp. 1135-1144, vol. 44, No. 6.

Leskela, M., et al., "Atomic layer deposition chemistry: recent developments and future challenges", "Angew. Chem. Int. Ed.", Nov. 24, 2003, pp. 5548-5554, vol. 42, No. 45.

Lu, H., et al., "Evolution of itinerant ferromagnetism in SrxPb1—xRuO3 (0 ≤x≤1): Interplay between Jahn-Teller distortion and A-site disorder", "Applied Physics Letters", Mar. 22, 2011, pp. 1-3, vol. 98, No. 122503.

Macomber, D., et al., "(n5—Cyclopentadienyl)- and (n5-Pentamethylcyclopentadienyl)copper Compounds Containing

(56) References Cited

OTHER PUBLICATIONS

Phosphine, Carbonyl, and n2-Acetylenic Ligands", "J. Am. Chem. Soc.", 1983, pp. 5325-5329, vol. 105.

McCormick, M., et al., "Solution Synthesis of Calcium, Strontium, and Barium Metallocenes", "Polyhedran", 1988, pp. 725-730, vol. 7, No. 9.

Niinistoe, J., et al., "Atomic Layer Deposition of High-k Oxides of the Group 4 Metals for Memory Applications", "Advanced Engineering Materials", Mar. 9, 2009, pp. 223-234, vol. 11, No. 4.

Papadatos, F., et al., "Characterization of Ruthenium and Ruthenium Oxide Thin Films deposited by Chemical Vapor Deposition for CMOS Gate Electrode Applications", "Mat. Res. Soc. Symp. Proc.", 2003, pp. N3.3.1-N3.3.6, vol. 745.

Ren, H., et al., "Synthesis and structures of cyclopentadienyl N-heterocyclic carbene copper(I) complexes", "Journal of Organometallic Chemistry", Jun. 21, 2006, pp. 4109-4113, vol. 691.

Selg, P., et al., "Solution Infrared Spectroscopic Studies on Equilibrium Reactions of Co With the Decamethylmetallocenes CP2MII, Where M = Mg, Ca, Sr, Ba, Sm, Eu, Yb", "Organometallics", Jun. 22, 2002, pp. 3100-3107, vol. 21, No. 15.

Singh, R., et al., "In-Situ Processing of Epitaxial Y—Ba—Cu—O High Tc Superconducting Films on (100) SrTiO3 and (100) YS—ZrO2 Substrates at 500-650 C", "Applied Physics Letters", May 29, 1989, pp. 2271-2273, vol. 54, No. 22.

Vehkamaki, M., et al., "Growth of SrTiO3 and BaTiO3 Thin Films by Atomic Layer Deposition", "Electrochemical Solid-State Letters", Aug. 5, 1999, pp. 504-506, vol. 2, No. 10.

Vehkamaki, M., et al., "Atomic Layer Deposition of SrTiO3 Thin Films from a Novel Strontium Precursor-Strontium-bis(tri-isopropylcyclopentadienyl", "Chemical Vapor Deposition", Mar. 2001, pp. 75-80, vol. 7, No. 2.

Wu, L., et al., "Humidity Sensitivity of Sr(Sn, Ti)03 Ceramics", "Journal of Electronic Materials", 1990, pp. 197-200, vol. 19, No. 2.

Note: For the non-patent literature citations that no month of publication is indicated, the year of publication is more than 1 year prior to the effective filing date of the present application.

* cited by examiner

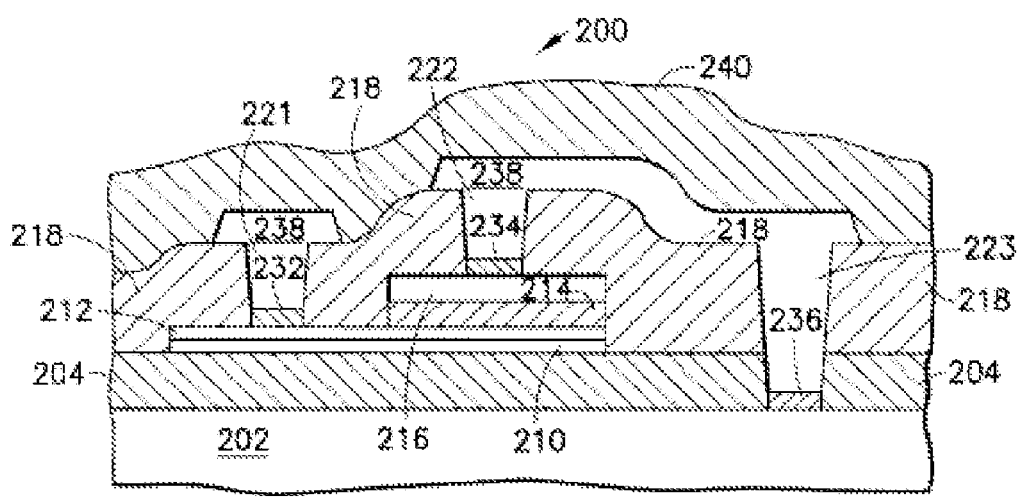

DOPING OF ZRO$_2$ FOR DRAM APPLICATIONS

CROSS-REFERENCE TO RELATED APPLICATIONS

This is a U.S. nation phase under 35 USC 371 of International Patent Application PCT/US11/41545 filed Jun. 23, 2011, which claims the benefit under 35 USC 119 of priority of U.S. Provisional Application 61/362,275 filed on Jul. 7, 2010. The disclosures of International Patent Application PCT/US11/41545and U.S. Provisional Application 61/362,275 are hereby incorporated herein by reference, in their respective entireties, for all purposes.

FIELD

The present disclosure relates to dielectric materials, and to dielectric material structures, such as ferroelectric capacitors, dynamic random access memory (DRAM) devices, and the like, incorporating such dielectric materials. More specifically, the disclosure in such aspect relates to doped zirconium oxide materials having utility for dynamic random access memory applications, and to use of silicon, germanium, titanium and niobium precursors useful as dopant source materials for forming such doped zirconium oxide materials. In another aspect, the disclosure relates to niobium precursors useful for forming niobium-containing materials on substrates by vapor deposition such as chemical vapor deposition (CVD), atomic layer deposition (ALD) or the like.

RELATED ART

The current generation of DRAM capacitors employs ZrO$_2$-based dielectrics. The zirconia dielectric material is formed on the device substrate for such capacitors by processes including vapor deposition of zirconium from suitable zirconium-containing metalorganic precursors.

Atomic layer deposition (ALD) has been used as a vapor deposition process technique for such dielectric formation.

When thin zirconium oxide films are deposited by an ALD process, it is important that the resulting product films possess electrical properties such as low leakage current and high dielectric constant.

It generally is desirable to achieve higher dielectric constants than 40 in the zirconium oxide dielectric film material.

In the field of niobium and niobium-containing materials, niobium precursors may be employed for vapor deposition of such materials. The art continually seeks new niobium precursors having high volatility, and good transport and deposition properties, and useful for forming such materials.

SUMMARY

The present invention relates to precursors useful for doping of zirconium oxide films, and to niobium precursors useful for forming of niobium and niobium-containing films.

In one aspect, the present disclosure relates to a method of forming a dielectric material, comprising doping a zirconium oxide material, using as a dopant precursor a precursor selected from the group consisting of Ti(NMe$_2$)$_4$; Ti(NMeEt)$_4$; Ti(NEt$_2$)$_4$; TiCl$_4$; tBuN=Nb(NEt$_2$)$_3$; tBuN=Nb(NMe$_2$)$_3$; t-BuN=Nb(NEtMe)$_3$; t-AmN=Nb(NEt$_2$)$_3$; t-AmN=Nb(NEtMe)$_3$; t-AmN=Nb(NMe$_2$)$_3$; t-AmN=Nb(OBu-t)$_3$; Nb-13; Nb(NEt$_2$)$_4$; Nb(NEt$_2$)$_5$; Nb(N(CH$_3$)$_2$)$_5$; Nb(OC$_2$H$_5$)$_5$; Nb(thd)(OPr-i)$_4$; SiH(OMe)$_3$; SiCl$_4$; Si(NMe$_2$)$_4$; (Me$_3$Si)$_2$NH; GeR$^3{}_x$(OR$^b$)$_{4-x}$ wherein x is from 0 to 4, each R$^a$ is independently selected from H or C$_1$-C$_8$ alkyl and each R$^b$ is independently selected from C$_1$-C$_8$ alkyl; GeCl$_4$; Ge(NR$^a{}_2$)$_4$ wherein each R$^a$ is independently selected from H and C$_1$-C$_8$ alkyl; and (R$^b{}_3$Ge)$_2$NH wherein each R$^b$ is independently selected from C$_1$-C$_8$ alkyl; bis(N, N'-diisopropyl-1,3-propanediamide) titanium; and tetrakis(isopropylmethylamido) titanium; wherein Me is methyl, Et is ethyl, Pr-i is isopropyl, t-Bu is tertiary butyl, t-Am is tertiary amyl, and thd is 2,2,6,6-tetramethyl-3,5-heptanedionate.

Another aspect of the disclosure relates to a niobium precursor, selected from the group consisting of:

t-BuN=Nb(NEt$_2$)$_3$
t-BuN=Nb(NEtMe)$_3$
t-AmN=Nb(NEt$_2$)$_3$
t-AmN=Nb(NEtMe)$_3$
t-AmN=Nb(NMe$_2$)$_3$
t-AmN=Nb(OBu-t)$_3$.

A further aspect of the disclosure relates to a method of forming a niobium or niobium-containing film on a substrate, comprising contacting the substrate with a precursor vapor of a precursor selected from the group consisting of:

t-BuN=Nb(NEt$_2$)$_3$
t-BuN=Nb(NEtMe)$_3$
t-AmN=Nb(NEt$_2$)$_3$
t-AmN=Nb(NEtMe)$_3$
t-AmN=Nb(NMe$_2$)$_3$
t-AmN=Nb(OBu-t)$_3$.

Other aspects, features and embodiments of the disclosure will be more fully apparent from the ensuing description and appended claims.

BRIEF DESCRIPTION OF THE DRAWINGS

FIG. 1 is a schematic cross-section of a semiconductor device utilizing a capacitor including a doped zirconium oxide dielectric material of the present disclosure.

DETAILED DESCRIPTION

The present disclosure relates in one aspect to doped zirconia dielectric materials having utility for dielectric material applications such as ferroelectric capacitors, dynamic random access memory (DRAM) devices, and to precursors useful as dopant source materials for such doped zirconia dielectric materials. In another aspect, the disclosure relates to niobium precursors useful in vapor deposition applications to form niobium-containing materials on substrates, by vapor deposition techniques such as atomic layer deposition (ALD) and chemical vapor deposition (CVD).

Various titanium, niobium, silicon and germanium dopant precursors can be utilized in accordance with the present disclosure for doping of dielectric materials such as zirconia. Examples of such precursors include Ti(NMe$_2$)$_4$; Ti(NMeEt)$_4$; Ti(NEt$_2$)$_4$; TiCl$_4$; tBuN=Nb(NEt$_2$)$_3$; tBuN=Nb(NMe$_2$)$_3$; t-BuN=Nb(NEtMe)$_3$; t-AmN=Nb(NEt$_2$)$_3$; t-AmN=Nb(NEtMe)$_3$; t-AmN=Nb(NMe$_2$)$_3$; t-AmN=Nb(OBu-t)$_3$; Nb-13; Nb(NEt$_2$)$_4$; Nb(NEt$_2$)$_5$; Nb(N(CH$_3$)$_2$)$_5$; Nb(OC$_2$H$_5$)$_5$; Nb(thd)(OPr-i)$_4$; SiH(OMe)$_3$; SiCl$_4$; Si(NMe$_2$)$_4$; (Me$_3$Si)$_2$NH; GeR$^3{}_x$(OR$^b$)$_{4-x}$ wherein x is from 0 to 4, each R$^a$ is independently selected from H or C$_1$-C$_8$ alkyl and each R$^b$ is independently selected from C$_1$-C$_8$ alkyl; GeCl$_4$; Ge(NR$^a{}_2$)$_4$ wherein each R$^a$ is independently selected from H and C$_1$-C$_8$ alkyl; and (R$^b{}_3$Ge)$_2$NH wherein each R$^b$ is independently selected from C$_1$-C$_8$ alkyl; bis(N,N'-diisopropyl-1,3-propanediamide) titanium; and tetrakis(isopropylmethylamido) titanium; wherein Me is methyl, Et is ethyl, Pr-i is isopropyl, t-Bu is tertiary butyl, t-Am is tertiary amyl, and thd is 2,2,6,6-tetramethyl-3,5-heptanedionate.

One general category of dopants that may be useful in the broad practice of the doping process of the disclosure includes titanium, niobium, silicon and germanium organo-compounds wherein the organo ligands are independently selected from among amide and alkoxy ligands. Preferred amide ligands include monoalkyl amide and dialkyl amide ligands, wherein alkyl substituent(s) are independently selected from among $C_1$-$C_8$ alkyl, e.g., amides such as dimethylamido, diethylamido, and methylethylamido. Preferred alkoxy ligands include $C_1$-$C_8$ alkyl moieties.

Precursors employed for vapor deposition processes such as chemical vapor deposition and atomic layer deposition require high volatility character. By way of specific example, t-BuN=Nb(NMe$_2$)$_3$ is a solid at room temperature. Both t-BuN=Nb(NEt$_2$)$_3$, and t-BuN=Nb(NEtMe)$_3$ are liquids at room temperatures. However, t-BuN=Nb(NEtMe)$_3$ has higher vapor pressure than t-BuN=Nb(NEt$_2$)$_3$, and is correspondingly preferred in vapor deposition processes, e.g., in an ALD process as a dopant precursor for doping of $ZrO_2$ films.

Because of its high volatility, and high diffusivity, t-BuN=Nb(NEtMe)$_3$ is a beneficial precursor for achieving uniform dopant concentration throughout a deposited zirconium oxide material, when such precursor is used in dopant for zirconia in vias or trench structures.

The disclosure in another aspect contemplates niobium precursors that are useful for forming niobium-containing materials on substrates, such as thin films containing niobium on semiconductor device substrates.

One aspect of the present disclosure relates to Nb precursors that can be used as precursors for niobium doping as well as for formation of Nb-containing materials. These precursors are set out in Table 1 below:

TABLE 1

| Precursor | Designations |
| --- | --- |
| t-BuN=Nb(NEt$_2$)$_3$ | NbD-1; TBTDEN |
| t-BuN=Nb(NEtMe)$_3$ | NbD-2; TBEMN (T50 = 161 C, Residue 0.5%) |
| t-AmN=Nb(NEt$_2$)$_3$ | NbD-3; TATDEN |
| t-AmN=Nb(NEtMe)$_3$ | NbD-4; TAEMN |
| t-AmN=Nb(NMe$_2$)$_3$ | NbD-5; TATDMN |
| t-AmN=Nb(OBu-t)$_3$ | NbD-6; TATBN |

In the foregoing table, t-Bu is tertiary butyl, Et is ethyl, Me is methyl, and t-Am is tertiary amyl.

Set out in Table 2 below are values of melting point, in degrees Centigrade (°C.), etc. which 50% of the material is volatilized, $T_{50}$, in degrees Centigrade (°C.), and the residue remaining after 100% of the material has been volatilized, in percent (%).

TABLE 2

|  | m.p. (° C.) | $T_{50}$ (° C.) | Residue (%) |
| --- | --- | --- | --- |
| TBTDEN (NbD-1) | Liquid at r.t. | 194 | 0.4 |
| TBEMN (NbD-2) | Liquid at r.t. |  |  |
| TATDEN (NbD-3) | Liquid at r.t. | 200 | 0.6 |
| TAEMN (NbD-4) | Liquid at r.t. | 186 | 0.9 |
| TATDMN (NbD-5) | 40 | 166 | 1.9 |
| TATBN (NbD-6) | Liquid at r.t. | 164 | 0.8 |

The niobium precursor t-AmN=Nb(NMe$_2$)$_3$, (TATDMN; NbD-5), may be volatilized to form a corresponding precursor vapor by sublimation heating of the solid precursor, for transport to the deposition chamber for contacting with the substrate on which niobium is to be deposited. The other liquid-form precursors may be volatilized by heating to form a corresponding precursor vapor, which then is transported to the deposition chamber. Alternatively, the liquid precursor may be introduced to the deposition apparatus via direct liquid injection (DLI) techniques, or the precursor may be subjected to flash vaporization, nebulization or other energetic input to generate a gas or vapor phase precursor for the deposition operation.

In applications in which precursors of the present disclosure are utilized to dope zirconium oxide materials, such dopant species can be present in the doped zirconium oxide material at any suitable concentration, e.g., such dopant species can be present in the doped zirconium oxide material at a concentration, c, that is greater than zero atomic percent (c>0 at %) and that does not exceed 10 atomic percent (c≤10 at %) of the doped zirconium oxide material.

Multiple precursors of the present disclosure may be utilized, having the same or different metal moieties in relation to one another. The organo moieties of such precursors, when multiple precursors are used with one another, should be compatible with one another, so that no deleterious ligand exchange reactions occur that would preclude or impair the efficacy of the respective precursors for their intended purpose. In addition, the dopant species themselves should be stoichiometrically and chemically compatible with one another.

The precursors of the present disclosure, when used as dopant species for zirconium oxide may be employed with the zirconium oxide material including a tetragonal zirconium oxide phase, with the dopant being incorporated to an extent that is effective to stabilize the tetragonal zirconium oxide phase, so that dielectric constant of the zirconium oxide material is higher than a corresponding zirconium oxide material lacking such dopant therein.

In a specific aspect, the disclosure relates to a zirconium oxide material including a tetragonal zirconium oxide phase and an effective amount of niobium to stabilize the tetragonal zirconium oxide phase so that dielectric constant of such zirconium oxide material is higher than a corresponding zirconium oxide material lacking titanium therein.

Yet another aspect of the disclosure relates to a process for forming a doped zirconium oxide material, comprising performing atomic layer deposition (ALD) with a chemical cocktail approach or a dual liquid injection approach to deposit the doped zirconium oxide material on a substrate, wherein the dopant includes at least one dopant species described herein, and stoichiometrically and chemically compatible combinations of such dopant species.

In a further aspect, the disclosure relates to a process for forming a zirconium oxide material, comprising performing atomic layer deposition (ALD) with a chemical cocktail approach or a dual liquid injection approach to deposit the doped zirconium oxide material on a substrate As used herein, the term "film" refers to a layer of deposited material having a thickness below 1000 micrometers, e.g., from such value down to atomic monolayer thickness values. In various embodiments, film thicknesses of deposited material layers in the practice of the disclosure may for example be below 100, 10, or 1 micrometers, or in various thin film regimes below 200, 100, or 50 nanometers, depending on the specific application involved. As used herein, the term "thin film" means a layer of a material having a thickness below 1 micrometer.

As used herein and in the appended claims, the singular forms "a", "and", and "the" include plural referents unless the context clearly dictates otherwise.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the present disclosure, and that ranges of carbon numbers specifically excluding a carbon number or numbers are included in the disclosure, and sub-ranges excluding either or both of carbon number limits of specified ranges are also included in the disclosure. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the disclosure, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the disclosure, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range.

In various embodiments, wherein dopant species of the present disclosure are employed to form doped zirconium oxide films, the dopant content in the zirconium oxide material does not exceed 10 at %. In various other embodiments, the dopant content in the respective zirconium oxide materials does not exceed specific lower values, e.g., dopant at % not exceeding 5, 4, 3, 2.5, 2, 1.5, 1, or 0.5 at % in such respective embodiments. In another specific embodiment, the dopant content of the zirconium oxide material is in a range of from 0.05 to 1.0 at %. Atomic percentages herein are based on the total atomic weight of the doped zirconium oxide material.

The present disclosure more generally contemplates a zirconium oxide material including a tetragonal zirconium oxide phase and an effective amount of one or more of the aforementioned dopant species to stabilize the tetragonal zirconium oxide phase so that dielectric constant of such zirconium oxide material is higher than a corresponding zirconium oxide material lacking such dopant species, e.g., titanium, therein.

Such doped zirconium oxide material, e.g., niobium-doped zirconium oxide material, in various embodiments has a dielectric constant that is greater than 40.

In addition to the dopant species described hereinabove, the zirconium oxide material may be co-doped with one or more additional dopant species selected from the group consisting of germanium, tantalum, boron, aluminum, gallium, the rare earth metals (viz., La, Ce, Pr, Nd, Sm, Eu, Gd, Tb, Dy, Ho, Er, Tm, Yb and Lu), and combinations of two or more of the foregoing dopant species.

The doped zirconium oxide material of the disclosure, e.g., Nb-containing zirconium oxide material, can be formed by ALD processes that are conducted to achieve the very low levels of the dopant species that are required to form dopant-stabilized films of high dielectric constant and superior electrical performance.

In various embodiments, a chemical cocktail approach is employed, or alternatively, in other embodiments, a dual liquid injection approach, to achieve zirconium oxide films having one or more dopant species incorporated therein at levels of 0<D≤10 at %, wherein D is the dopant, and the dopant comprises at least one dopant species of the present disclosure.

The chemical cocktail approach involves mixing source reagents, including dopant precursor, e.g., a niobium precursor, and a zirconium precursor, at a predefined ratio. The mixture created in this fashion is a cocktail. The ratio of zirconium to dopant, e.g., niobium, in the cocktail can be tailored to achieve the desired at % dopant incorporation in the film in a range of 0<D≤10 at %.

The dual liquid injection approach involves using at least two vaporizers coupled in feed relationship to an ALD chamber where one vaporizer delivers dopant precursor, e.g., niobium precursor, and another vaporizer delivers a zirconium precursor. The amount of dopant in the film can be regulated by metering the amount of dopant that is co-injected with the zirconium precursor to achieve the dopant-stabilized zirconium oxide film wherein 0<D≤10 at %, wherein D is the dopant. In instances in which two or more dopant species are employed as the zirconium oxide dopant, a corresponding number of vaporizers for each of the multiple dopant species may be employed.

The choice of precursors for cocktail vaporization or direct liquid injection co-injection is important. The precursors must be compatible under the deposition/delivery conditions to avoid issues such as particle formation deriving from reaction of one precursor with another. In one preferred embodiment, niobium and zirconium precursors with identical ligand arrangements are used, i.e., wherein the same type or types of substituent moieties are employed in both the niobium as well as the zirconium precursor. Ligand species can be of any suitable type, and may for example in specific embodiments be selected from among amides, cyclopentadienyls, amidinates, guanidinates, isoureates, beta-diketonates, etc. Precursors can include homoleptic as well as mixed ligand heteroleptic compounds, the choice of a specific set of precursors being readily determinable within the skill of the art without undue effort, based on the disclosure herein, e.g., by empirical utilization of specifically selected precursors and characterization of resulting films.

Illustrative zirconium precursors can include the following: $Zr(OiPr)_2(thd)_2$, $Zr(OtBu)_4$, $Zr(thd)_4$, or other $C_1$-$C_{12}$ alkoxy zirconium beta-diketonates, or any other suitable metalorganic precursors for the zirconium constituent of the dielectric film.

It will be appreciated that a wide variety of different precursors may be employed for forming dielectric doped zirconia materials of the present disclosure.

The vapor deposition, e.g., ALD, process that is used to form the dopant-stabilized zirconium oxide dielectric material of the present disclosure can be carried out in any suitable manner to produce the above-described films, within the skill of the art, based on the disclosure herein. For example, ALD process parameters, e.g., pulse times, cycle durations, temperatures, pressures, volumetric flow rates, etc. can be determined by simple successive empirical runs in which process parameters are selectively varied to determine the best multivariable process envelope for conducting the vapor deposition process.

FIG. 1 is a schematic cross-section of a semiconductor device utilizing a capacitor including a niobium-stabilized zirconium oxide dielectric material of the present disclosure.

The semiconductor device 200 is shown in the process of fabrication. Device 200 includes a semiconductor substrate 202 that may include active device structures, not shown, and an insulator layer 204. The semiconductor substrate 202 may be silicon, doped silicon, or another semiconductor material.

The insulator layer 204 is deposited on the substrate 202 by any suitable deposition process. The insulator layer 204 may be, for example, silicon dioxide, silicon nitride, or some combination thereof.

A conductive diffusion barrier layer 210, such as titanium aluminum nitride TiAlN, is deposited over the insulator layer 204. A layer of conductive material 212, such as iridium, iridium oxide, platinum or combinations thereof, is deposited over the conductive diffusion barrier layer 210. Next, a layer of high dielectric constant material 214, comprising the doped zirconium oxide material of the present disclosure, is deposited by ALD over the conductive layer 212. A second layer of conductive material 216, such as iridium, iridium oxide, platinum, or combinations thereof, is shown deposited over the layer of high dielectric constant material 214.

A diffusion barrier material such as titanium aluminum nitride (TiAlN) will substantially reduce the possibility of diffusion of oxygen during subsequent processing steps that require high temperatures. Other materials can be used for the diffusion barrier, within the skill of the art.

FIG. 1 shows the portion of the device 200 after the device has been patterned with photoresist and etched. Desired portions of the conductive diffusion barrier layer, upper and lower layers of iridium or other conductive material and of the high dielectric constant material are left to form the upper electrode 216, capacitor dielectric 214, lower electrode 212, and lower electrode barrier layer 210.

A layer of interlevel dielectric 218, such as silicon dioxide or silicon nitride, is deposited. The layer of interlevel dielectric is patterned with photoresist and etched to form contact plug holes 221, 222, and 223. The insulator is etched down at the contact plug hole locations 221 and 222 until the iridium or other conductor of the lower electrode 212 and the upper electrode 216, respectively, are reached. Similarly, the contact plug hole 223 is etched down through the insulator layers 218 and 204 until the semiconductor substrate is reached. Once the contact plug openings are prepared, the device 200 is ready for deposition of a layer of oxidation-barrier material.

The semiconductor device 200 is depicted in FIG. 1 following an overall etch of the diffusion barrier layer leaving a diffusion barrier layer 232 in contact with the lower capacitor electrode 212, a diffusion barrier layer 234 in contact with the upper capacitor electrode 216, and a diffusion barrier layer 236 in contact with the semiconductor substrate 202. A transfer transistor of the memory cell may be located below the diffusion barrier layer 236 (not shown). As an alternative to the aforementioned diffusion barrier deposition scheme, the barrier layers 232, 234, and 236 could be deposited as a single continuous layer prior to the capacitor stack etch and deposition of insulating layer 218. According to this alternative configuration, the barrier layer could be patterned and used as a hardmask for the subsequent patterning of the capacitor stack. The alternative process flow would continue with the deposition and patterning of the insulating layer 218.

A conductive material, or metallization, then is deposited over the interlevel dielectric 218 and the diffusion barrier layers 232, 234, and 236. The conductive material 238 makes contact with the diffusion barrier layers 232, 234, and 236. The conductive material 238 may be selected from a group of conductive materials such as aluminum, aluminum alloys, tungsten, tungsten alloys, iridium, and iridium alloys. The diffusion barrier layers 232, 234, and 236 significantly reduce the possibility of any diffusion of the layer of conductive material 238 to the capacitor electrodes 212 and 216 of the semiconductor substrate 202.

FIG. 1 shows the semiconductor device 200 after the layer of conductive material 238 is patterned and etched to form desired lead lines in the layer of conductive material. The pattern is formed of photoresist material. Etching is accomplished in accordance with well-established practices known to those of ordinary skill in the semiconductor manufacturing field.

Next, a layer of passivation dielectric 240 is deposited over the conductive material layer 238 and the interlevel dielectric 218. The passivation dielectric may include a material such as silicon dioxide, silicon nitride, or other insulator to provide mechanical and electrical protection for the top surface of the semiconductor device. Material of the passivation dielectric layer 240 is deposited by well-known techniques known to those of ordinary skill in the semiconductor manufacturing field.

The present disclosure thus provides vapor-deposited zirconium oxide films in which niobium or other specific dopant is usefully employed to stabilize the tetragonal zirconium oxide phase and enable devices, e.g., capacitors, DRAM devices, etc., with dielectric material having high dielectric constant and exhibiting superior electrical performance.

In applications in which niobium precursors of the present disclosure are utilized to form niobium or niobium-containing films on substrates, rather than for doping of zirconium oxide, the substrate may be of any suitable type, e.g., a silicon wafer or a semiconductor manufacturing device substrate of other composition. The formation of the niobium or niobium-containing material on the substrate can be carried out under vapor deposition conditions, e.g., by CVD or ALD, in an appropriate deposition apparatus. The niobium precursor may be volatilized and introduced to the deposition chamber of such apparatus as previously described, at temperature, pressure, flow rate and concentration conditions that may be appropriately determined within the skill of the art, based on the disclosure herein, to provide Nb or Nb-containing films of desired character.

Such niobium or niobium-containing films can be utilized for device applications of widely varying character, including for example niobium Josephson junction devices, niobium-containing superconductor devices or materials, niobium oxide capacitors, niobium nitride Josephson devices, niobium carbide contacts for nanotube device applications, and niobium oxide (poly[2-methoxy, 5-(2-ethylhexoxy)-1,4-phenylene vinylene]) hybrid solar cells.

While the disclosure has been has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A method of forming a dielectric material, comprising doping, with only a single dopant selected from the group consisting of niobium, titanium, silicon, and germanium, a zirconium oxide material comprising a tetragonal zirconium oxide phase, using as a dopant precursor a precursor selected from the group consisting of $Ti(NMe_2)_4$; $Ti(NMeEt)_4$; $Ti(NEt_2)_4$; $TiCl_4$; $tBuN=Nb(NEt_2)_3$; $tBuN=Nb(NMe_2)_3$; $t$-$BuN=Nb(NEtMe)_3$; $t$-$AmN=Nb(NEt_2)_3$; $t$-$AmN=Nb(NEtMe)_3$; $t$-$AmN=Nb(NMe_2)_3$; $t$-$AmN=Nb(OBu$-$t)_3$; Nb-13; $Nb(NEt_2)_4$; $Nb(NEt_2)_5$; $Nb(N(CH_3)_2)_5$; $Nb(OC_2H_5)_5$; $Nb(thd)(OPr$-$i)_4$; $SiH(OMe)_3$; $SiCl_4$; $Si(NMe_2)_4$; $(Me_3Si)_2NH$; $GeR^a_x(OR^b)_{4-x}$ wherein x is from 0 to 4, each $R^a$ is independently selected from H or $C_1$-$C_8$ alkyl and each $R^b$ is independently selected from $C_1$-$C_8$ alkyl; $GeCl_4$; $Ge(NR^a{}_2)_4$ wherein each $R^a$ is independently selected from H and $C_1$-$C_8$ alkyl; and $(R^b{}_3Ge)_2NH$ wherein each $R^b$ is independently selected from $C_1$-$C_8$ alkyl; bis(N,N'-diisopropyl-1,3-propanediamide) titanium; and tetrakis(isopropylmethylamido) titanium; wherein Me is methyl, Et is ethyl, Pr-i is isopropyl, t-Bu is tertiary butyl, t-Am is tertiary amyl, and thd is 2,2,6,6-tetramethyl-3,5-heptanedionate; wherein the amount of said dopant is effective to stabilize the tetragonal zirconium oxide phase so that the dielectric constant of said dielectric material is greater than 40, and wherein when the dopant precursor comprises Nb, the amount of said dopant does not exceed 3 at %.

2. The method of claim 1, wherein the dopant precursor comprises a niobium precursor selected from the group consisting of tBuN=Nb(NEt$_2$)$_3$, tBuN=Nb(NMe$_2$)$_3$, t-BuN=Nb(NEtMe)$_3$, t-AmN=Nb(NEt$_2$)$_3$, t-AmN=Nb(NEtMe)$_3$, t-AmN=Nb(NMe$_2$)$_3$, t-AmN=Nb(OBu-t)$_3$, Nb-13, Nb(NEt$_2$)$_4$, Nb(NEt$_2$)$_5$, Nb(N(CH$_3$)$_2$)$_5$, Nb(OC$_2$H$_5$)$_5$, and Nb(thd)(OPr-i)$_4$.

3. The method of claim 1, wherein the dopant precursor comprises a niobium precursor selected from the group consisting of:
t-BuN=Nb(NEt$_2$)$_3$
t-BuN=Nb(NEtMe)$_3$
t-AmN=Nb(NEt$_2$)$_3$
t-AmN=Nb(NEtMe)$_3$
t-AmN=Nb(NMe$_2$)$_3$
t-AmN=Nb(OBu-t)$_3$.

4. The method of claim 1, wherein the dielectric material is formed on a semiconductor device substrate by vapor deposition of zirconium from a zirconium precursor and vapor deposition of the dopant from the dopant precursor, wherein the zirconium precursor and the dopant precursor comprise identical substituent moieties.

5. The method of claim 1, wherein the dielectric material is a part of a capacitor device.

6. The method of claim 1, wherein the dielectric material as part of a dynamic random access memory device.

7. The method of claim 1, wherein the doping is carried out in a vapor deposition process.

8. The method of claim 7, wherein the vapor deposition process comprises chemical vapor deposition.

9. The method of claim 7, wherein the vapor deposition process comprises atomic layer deposition.

10. A method of forming a dielectric material, comprising doping, with only a single dopant selected from the group consisting of niobium, titanium, silicon, and germanium, a zirconium oxide material comprising a tetragonal zirconium oxide phase, using as a dopant precursor a precursor selected from the group consisting of tBuN=Nb(NMe$_2$)$_3$; t-BuN=Nb(NEtMe)$_3$; t-AmN=Nb(NEt$_2$)$_3$; t-AmN=Nb(NEtMe)$_3$; t-AmN=Nb(NMe$_2$)$_3$; t-AmN=Nb(OBu-t)$_3$; Nb-13; Nb(NEt$_2$)$_4$; Nb(NEt$_2$)$_5$; Nb(OC$_2$H$_5$)$_5$; Nb(thd)(OPr-i)$_4$; SiH(OMe)$_3$; SiCl$_4$; Si(NMe$_2$)$_4$; (Me$_3$Si)$_2$NH; GeR$^a{}_x$(OR$^b$)$_{4-x}$ wherein x is from 0 to 4, each $R^a$ is independently selected from H or $C_1$-$C_8$ alkyl and each $R^b$ is independently selected from $C_1$-$C_8$ alkyl; GeCl$_4$; Ge(NR$^a{}_2$)$_4$ wherein each $R^a$ is independently selected from H and $C_1$-$C_8$ alkyl; and (R$^b{}_3$Ge)$_2$NH wherein each $R^b$ is independently selected from $C_1$-$C_8$ alkyl; bis(N,N'-diisopropyl-1,3-propanediamide) titanium; and tetrakis(isopropylmethylamido) titanium; wherein Me is methyl, Et is ethyl, Pr-i is isopropyl, t-Bu is tertiary butyl, t-Am is tertiary amyl, and thd is 2,2,6,6-tetramethyl-3,5-heptanedionate; wherein the amount of said dopant is effective to stabilize the tetragonal zirconium oxide phase so that the dielectric constant of said dielectric material is greater than 40, and wherein when the dopant precursor comprises Nb, the amount of said dopant does not exceed 3 at %.

11. The method of claim 10, wherein the dopant precursor comprises a niobium precursor selected from the group consisting of tBuN=Nb(NMe$_2$)$_3$, t-BuN=Nb(NEtMe)$_3$, t-AmN=Nb(NEt$_2$)$_3$, t-AmN=Nb(NEtMe)$_3$, t-AmN=Nb(NMe$_2$)$_3$, t-AmN=Nb(OBu-t)$_3$, Nb-13, Nb(NEt$_2$)$_4$, Nb(NEt$_2$)$_5$, Nb(OC$_2$H$_5$)$_5$, and Nb(thd)(OPr-i)$_4$.

12. The method of claim 10, wherein the dopant precursor comprises a niobium precursor selected from the group consisting of:
t-BuN=Nb(NEtMe)$_3$
t-AmN=Nb(NEt$_2$)$_3$
t-AmN=Nb(NEtMe)$_3$
t-AmN=Nb(NMe$_2$)$_3$
t-AmN=Nb(OBu-t)$_3$.

13. The method of claim 1, wherein the dopant precursor is selected from the group consisting of Ti(NNe$_2$)$_4$; Ti(Net$_2$)$_4$; TiCl$_4$; SiH(OMe)$_3$; SiCl$_4$; Si(NME$_2$)$_4$; (Me$_3$Si)$_2$NH; GeR$^a{}_x$(OR$^b$)$_{4-x}$ wherein x is from 0 to 4, each $R^a$ is independently selected from H or $C_1$-$C_8$ alkyl and each $R^b$ is independently selected from $C_1$-$C_8$ alkyl; GeCl$_4$; Ge(NR$^a{}_2$)$_4$ wherein each $R^a$ is independently selected from H and $C_1$-$C_8$ alkyl; and (R$^b{}_3$Ge)$_2$NH wherein each $R^b$ is independently selected from $C_1$-$C_8$ alkyl; bis(N,N'-diisopropyl-1,3-propanediamide) titanium; and tetrakis(isopropylmethylamido) titanium; wherein Me is methyl, and Et is ethyl.

14. The method of claim 1, wherein the dopant precursor is selected from the group consisting of Ti(NMe$_2$)$_4$; Ti(NMeEt)$_4$; Ti(NEt$_2$)$_4$; TiCl$_4$; bis(N,N'-diisopropyl-1,3-propanediamide) titanium; and tetrakis(isopropylmethylamido) titanium; wherein Me is methyl, and Et is ethyl.

15. The method of claim 1, wherein the dopant precursor is selected from the group consisting of SiH(OMe)$_3$; SiCl$_4$; Si(NMe$_2$)$_4$; and (Me$_3$Si)$_2$NH; wherein Me is methyl, and Et is ethyl.

16. The method of claim 1, wherein the dopant precursor is selected from the group consisting of GeR$^a{}_x$(OR$^b$)$_{4-x}$ wherein x is from 0 to 4, each $R^a$ is independently selected from H or $C_1$-$C_8$ alkyl and each $R^b$ is independently selected from $C_1$-$C_8$ alkyl; GeCl$_4$; Ge(NR$^a{}_2$)$_4$ wherein each $R^a$ is independently selected from H and $C_1$-$C_8$ alkyl; and (R$^b{}_3$Ge)$_2$NH wherein each $R^b$ is independently selected from $C_1$-$C_8$ alkyl.

17. The method of claim 1, wherein the dopant precursor comprises Nb, and the amount of said dopant does not exceed 2.5 at %.

18. The method of claim 1, wherein the dopant precursor comprises Nb, and the amount of said dopant does not exceed 2 at %.

19. The method of claim 1, wherein the dopant precursor comprises Nb, and the amount of said dopant is in a range of from 0.05 to 1.0 at %.

20. The method of claim 1, wherein the dopant is niobium, and the dielectric material is formed by a chemical cocktail process or a dual liquid injection process, said method comprising use of niobium precursor and zirconium precursor to form the dielectric material, wherein the same ligand species are present in both the niobium precursor and the zirconium precursor.

* * * * *